(12) United States Patent
Chan et al.

(10) Patent No.: US 6,784,665 B1
(45) Date of Patent: Aug. 31, 2004

(54) MULTIPLE DEGREE OF FREEDOM ADJUSTABLE MRI RADIO FREQUENCY ARRAY COIL SYSTEM

(75) Inventors: Pei Hsuon Chan, Aurora, OH (US); Mark Xueming Zou, Aurora, OH (US); Richard Calvin Lute, Jr., Mogadore, OH (US); Scott Anthony Masiella, Silver Lake, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/299,449

(22) Filed: Nov. 19, 2002

Related U.S. Application Data
(60) Provisional application No. 60/333,100, filed on Nov. 19, 2001.

(51) Int. Cl.[7] .................................................. G01V 3/00
(52) U.S. Cl. ........................................ 324/318; 324/309
(58) Field of Search ................................. 324/318, 309, 324/307; 600/422, 410; 606/130

(56) References Cited

U.S. PATENT DOCUMENTS

| | | | |
|---|---|---|---|
| 4,692,705 A | 9/1987 | Hayes | 324/318 |
| 4,825,162 A | 4/1989 | Roemer et al. | 324/318 |
| 5,085,219 A * | 2/1992 | Ortendahl et al. | 600/422 |
| 5,166,618 A * | 11/1992 | Jones et al. | 324/318 |
| 5,361,765 A * | 11/1994 | Herlihy et al. | 600/422 |
| 5,370,118 A * | 12/1994 | Vij et al. | 600/422 |
| 5,517,120 A | 5/1996 | Misic et al. | 324/318 |
| 5,602,479 A | 2/1997 | Srinivasan et al. | 324/318 |
| 5,664,568 A * | 9/1997 | Srinivasan et al. | 600/422 |
| 6,150,816 A | 11/2000 | Srinivasan | 324/318 |
| 6,177,797 B1 * | 1/2001 | Srinivasan | 324/318 |
| 6,261,299 B1 * | 7/2001 | Chakeres | 606/130 |
| 6,317,619 B1 * | 11/2001 | Boernert et al. | 600/410 |
| 6,356,081 B1 * | 3/2002 | Misic | 324/318 |
| 6,591,128 B1 * | 7/2003 | Wu et al. | 600/422 |

OTHER PUBLICATIONS

"Novel Two Channel Volume Array Design for Angiography of the Head and Neck", Reykowski et al., SMR 2$^{nd}$ Annual Meeting, San Francisco, CA., p. 216 (1994).

"A Phased Array Coil Optimized for Carotid Artery Imaging", Bernstein et al., ISMRM Seventh Annual Meeting, Philadelphia, PA., p. 163 (1999).

* cited by examiner

*Primary Examiner*—Diego Gutierrez
*Assistant Examiner*—Tiffany A. Fetzner
(74) *Attorney, Agent, or Firm*—Michael A. Della Penna; Armstrong Teasdale, LLP

(57) ABSTRACT

A MRI array coil for imaging a patient having a head, and a torso, includes a base; a left handle extending from the base; a left head coil array attached to the left handle for proximity to the head; a right handle extending from the base; and a right head coil array mounted on the right handle for proximity to the head.

20 Claims, 8 Drawing Sheets

MULTIPLE DEGREE OF FREEDOM ADJUSTABLE MRI RADIO FREQUENCY ARRAY COIL SYSTEM

This application claims the benefit of Provisional application Ser. No. 60/333,100, filed Nov. 19, 2001.

BACKGROUND OF THE INVENTION

The invention relates to Magnetic Resonance Imaging (MRI systems, and particularly to the Radio-Frequency (RF) coils used in such systems.

The following references are incorporated herein by reference.

A. U.S. Patent Documents

| (1) | 4,692,705 | September 1987 | Hayes |
|---|---|---|---|
| (2) | 4,825,162 | April 1989 | Roemer, et al. |
| (3) | 55,517,120 | May 1996 | Misic, et al. |
| (4) | 5,602,479 | February 1997 | Srinivasan, et al. |
| (5) | 5,664,568 | September 1997 | Srinivasan, et al. |
| (6) | 6,150,816 | November 2000 | Srinivasan |

B. Other References (1) "Novel Two Channel Volume Array Design for Angiography of the Head and Neck", Reykowski, et al., SMR 2$^{nd}$ Annual Meeting, San Francisco, Calif., p.216 (1994).

(2) "A Phased Array Coil Optimized for Carotid Artery Imaging", Bernstein, et al., ISMRM Seventh Annual Meeting, Philadelphia, Pa., p163 (1999).

Magnetic Resonance Imaging (MRI) utilizes hydrogen nuclear spins of the water molecules in the human body, which are polarized by a strong, uniform, static magnetic field of the magnet (named $B_0$—the main magnetic field in MRI physics). The magnetically polarized nuclear spins generate magnetic moments in the human body. The magnetic moments point in the direction of the main magnetic field in a steady state, and produce no useful information if they are not disturbed by any excitation.

The generation of the Nuclear Magnetic Resonance (NMR) signal for MRI data acquisition is accomplished by exciting the magnetic moments with a uniform Radio-Frequency (RF) magnetic field (named the $B_1$ field or the excitation field). The $B_1$ field is produced in the imaging region of interest by an RF transmit coil which is driven by a computer-controlled RF transmitter with a power amplifier. During excitation, the nuclear spin system absorbs magnetic energy, and its magnetic moments precess around the direction of the main magnetic field. After excitation, the precessing magnetic moments will go through a process of Free Induction Decay (FID), releasing their absorbed energy and returning to the steady state. During free induction decay, NMR signals are detected by the use of a receive RF coil, which is placed in the vicinity of the excited volume of the human body. The NMR signal is the secondary electrical voltage (or current) in the receive RF coil that has been induced by the precessing magnetic moments of the human tissue. The receive RF coil can be either the transmit coil itself, or an independent receive-only RF coil. The NMR signal is used for producing images by using additional pulsed magnetic gradient fields, which are generated by gradient coils integrated inside the main magnet system. The gradient fields are used to spatially encode the signals and selectively excite a specific volume of the human body. There are usually three sets of gradient coils in a standard MRI system, which generate magnetic fields in the same direction of the main magnetic field, varying linearly in the imaging volume.

In MRI, it is desirable for the excitation and reception to be spatially uniform in the imaging volume for better image uniformity. In a standard MRI system, the best excitation field homogeneity is usually obtained by using a "whole-body" volume RF coil for transmission. The "whole-body" transmit coil is the largest RF coil in the system. A large coil however, produces lower signal-to-noise ratio (SNR or S/N) if it is also used for reception, mainly because of its greater distance from the signal-generating tissues being imaged. Since a high signal-to-noise ratio is desirable in MRI, special-purpose coils are used for reception to enhance the S/N ratio from the volume of interest.

In practice, a well-designed specialty RF coil should have the following functional properties: high S/N ratio, good uniformity, high unloaded quality factor (Q) of the resonance circuit, and high ratio of the unloaded to loaded Q factors. In addition, the coil device should be mechanically designed to facilitate patient handling and comfort, and to provide a protective barrier between the patient and the RF electronics. Another way to increase the SNR is by quadrature reception. In this method, NMR signals are detected in two orthogonal directions, which are in the transverse plane or perpendicular to the main magnetic field. The two signals are detected by two independent individual coils which cover the same volume of interest. With quadrature reception, the SNR can be increased by up to $\sqrt{2}$ over that of the individual linear coils.

In Magnetic Resonance Imaging (MRI and Magnetic Resonance Angiography (MRA), a carotid RF coil is used to generate high resolution and good SNR images for the carotid arteries with a coverage of about 16 cm. In addition, it is also desirable to use the same carotid coil to cover the arteries for a full field of view (FOV) (about 46 cm for the most of the patient population) from the circle of Willis to the aortic arch with good SNR and image uniformity. For the carotid artery imaging, the performance (i.e., SNR and image resolution) of a carotid coil should be better than that of a neurovascular coil. For the full FOV imaging from the circle of Willis to the aortic arch, the SNR and image uniformity of a carotid coil should be comparable to those of a neurovascular coil. It is also desirable for a carotid coil to be able to do bilateral imaging and unilateral imaging as well.

To cover the blood vessels from the circle of Willis to the aortic arch, a quadrature RF coil was built by Misic, et al. (U.S. Pat. No. 5,517,120). This neurovascular coil utilizes multiple horizontal conductors and end conductors to distribute the current such that two orthogonal magnetic modes (i.e., one horizontal field and one vertical field) are created by the coil to achieve the quadrature detection of the magnetic resonance signal.

A split-top, four channel, birdcage type array coil was also developed by Srinvasan, et al. (U.S. Pat. Nos. 5,664,568; 5,602,479) for head, neck and vascular imaging. This split-top head and neck coil consists of a birdcage head coil (Hayes, U.S. Pat. No. 4,692,705) and two distributed type (flat birdcage type) coils: one for the anterior neck-torso and the other for the posterior neck-torso. The quadrature signal obtained with the head coil is separated into two channels. The anterior and posterior neck-torso coils form the other two channels. The inductive coupling between the neck-torso coils and the head coil is minimized by overlapping the neck-torso coils with the head coil.

The development of array coil technology (Roemer, et al., U.S. Pat. No. 4,825,162) allows one to image a large field-of-view (FOV) while maintaining the SNR characteristic of a small and conformal coil. Using this concept, a two-channel (four linear coils) volume array coil for magnetic resonance angiography of the head and neck was implemented by Reykowski, et al. The first channel is a four bar quadrature head coil consisting of two linear coils. Two Helmholtz type coils form the second channel for covering the neck and chest. The two Helmholtz type coils are arranged such that the magnetic fields generated by them are diagonally oriented and perpendicular to each other (i.e., a quadrature coil pair). The quadrature neck coil is attached to the quadrature head coil. Each of the two Helmholtz type neck coils overlaps with the head coil to minimize the inductive coupling between the head and neck coils, i.e., the neck coils are critically coupled to the head coil, to reduce the noise correlation caused by the cross-talk between the head and the neck coils.

By realizing that the largest part of the carotid arteries lie near the surface of the skin, one can obtain good SNR and high resolution images of the carotid arteries by using smaller size surface coils placing very close the skin rather than using large volume type coils, a 6-element phased array surface coil was developed by Bernstein, et al. dedicated for carotid artery imaging. This carotid coil is flexible. It lies on the patient's sternum, wraps around the neck and extends to the each side of the head. The carotid coil consists of four 10 cm diameter loop coils, two on each side of the head, for imaging the carotid arteries from the shoulder up (i.e., toward the superior direction or the circle of Willis direction) and two rectangular shape loop coils of size of 4×6 cm and 5×8 cm, respectively, for imaging the arteries from the shoulder down (i.e., toward the inferior direction or the aortic arch direction). Each pair of the two 10 cm diameter loop coils is combined (or multiplexed) into one channel. Therefore, the pair of the two 10 cm diameter loop coils on the right hand side forms one channel to cover the right carotid artery, the pair on the left hand side forms the second channel to cover the left carotid artery and the rectangular loop coils (i.e., the 4×6 cm and 5×8 cm ones) form another two channels to cover the arteries at the chest region. It has been shown that this carotid coil can provide much better SNR and higher resolution for imaging the arteries around the carotid bifurcation than does a commercial neurovascular coil. The total coverage of this carotid coil is about 24 cm.

In R. Srinivasan (U.S. Pat. No. 6,150,816) a three-element mutually decoupled RF coil system, for example, 3 loop coils, was discussed. The two smaller loop coils are overlapped to isolate them from each other. The third large loop coil, which is the same size as the two combined small loop coils, is superimposed on the two small loop coils and physically connected to them. This can be done such that these three loop coils isolate from each other simultaneously. A procedure of iterating testing was developed for optimizing all the three coils of the integrated system. Therefore, the three coils can be turned on simultaneously to receive signals without interfering with each other.

The neurovascular coils (Misic, et al., U.S. Pat. No. 5,517,120 and Srinvasan, et al., U.S. Pat. Nos. 5,664,568 and 5,602,479) and head-neck coil (Reykowski, et al.) are volume type coils. These coils use large coil elements to cover the entire imaging volume (i.e., head and neck). The coil elements are too far away from the carotid arteries to provide good enough SNR and are too large to provide high enough resolution for the carotid artery imaging.

The 6-element phased array surface coil system (Bernstein, et al.) has a limited coverage range of about 24 cm. This coverage is not enough for imaging the arteries from the circle of Willis to the aortic arch for most of the patient population. Therefore, this coil is designed mainly for providing high resolution images for the carotid artery imaging around the carotid bifurcation. Another disadvantage of this design is the combination of the two small 10 cm loop coils into one channel. Combining the two coils into one channel will lower the SNR and resolution of the images compared to using the two coils as two individual channels.

For the three-element mutually decoupled RF coil system (R. Srinivasan, U.S. Pat. No. 6,150,816), the large coil needs to have a size same as the combination of the two small coils. In other words, the large coil cannot be made bigger than the combination of the two small coils. This indicates that the three-element RF coil system can either be used as a high resolution coil by making all the three coils small or be used for covering a large FOV by making all the three coils large. Therefore, the three-element RF coil system cannot be a high resolution and large FOV coil system at the same time. Furthermore, it is not easy to isolate all the three coil elements simultaneously and a complicated iterative testing process is needed for achieving that.

SUMMARY OF THE INVENTION

A MRI array coil for imaging a patient having a head, and a torso, includes a base; a left handle extending from the base; a left head coil array attached to the left handle for proximity to the head; a right handle extending from the base; and a right head coil array mounted on the right handle for proximity to the head.

DETAILED DESCRIPTION OF THE PREFERRED EMBODIMENTS

Figure 1:
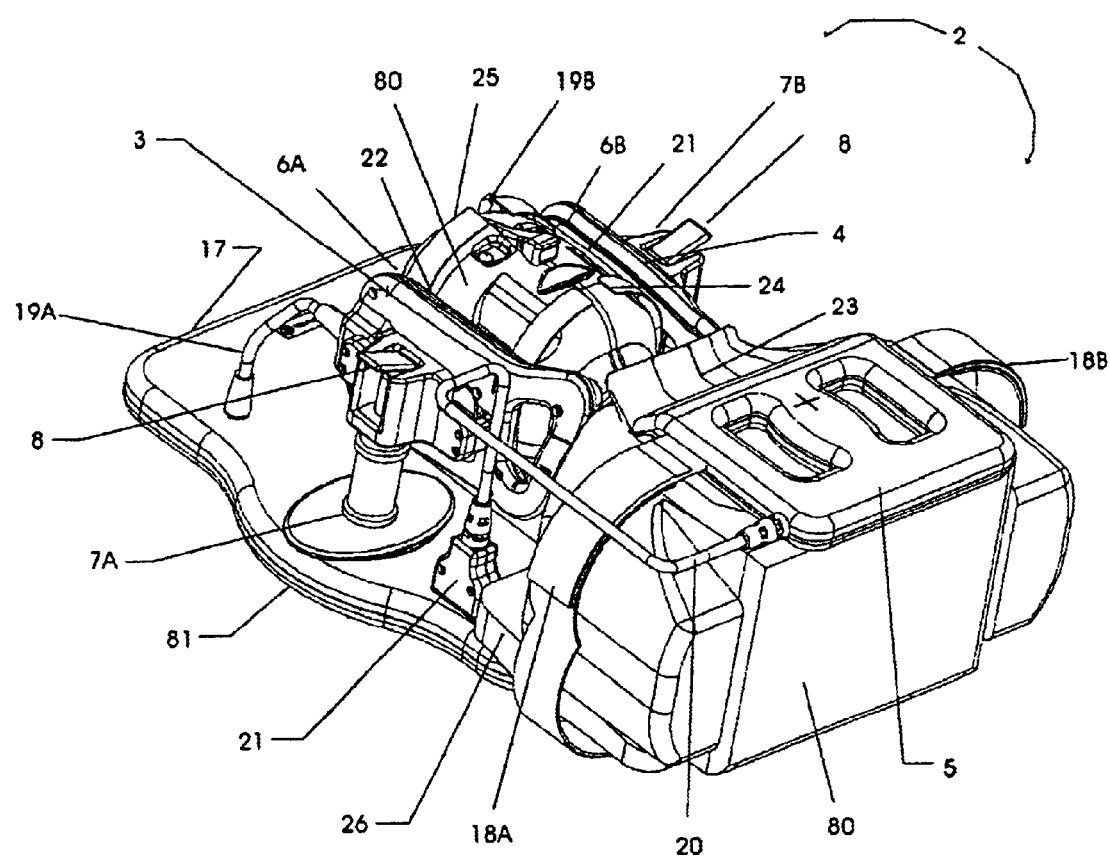
FIG. 1 is a perspective view of a MRI array coil according to the invention.
Figure 2:
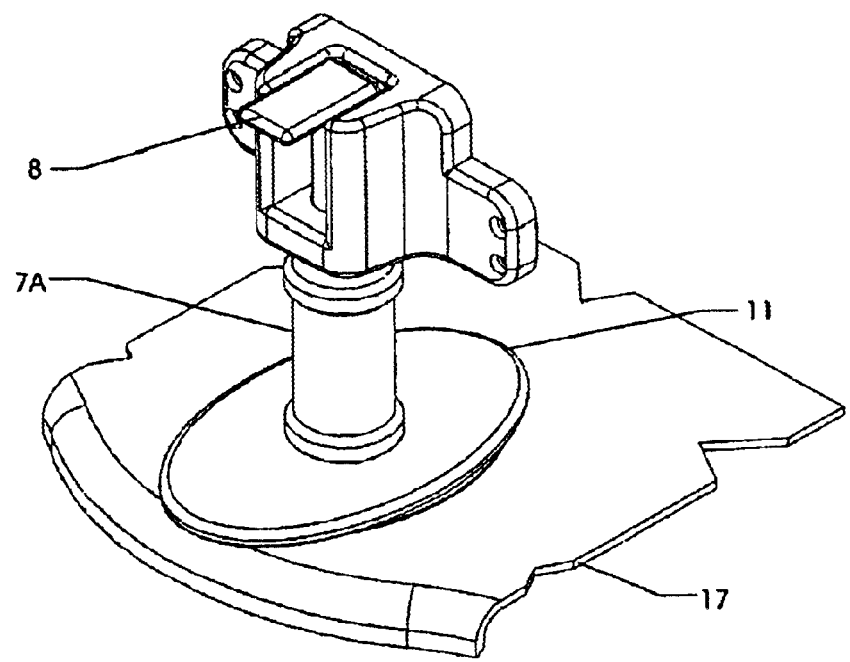
FIG. 2 is a perspective view of an adjustable handle for according to the invention in the "locked" position.

Referring to FIG. 1, the MRI array coil 2 may includes four major sections: the right head piece 3 for the right head coil, the left head piece 4 for the left head coil, the chest piece 5 for the anterior torso coil and the base 81.

Figure 3:
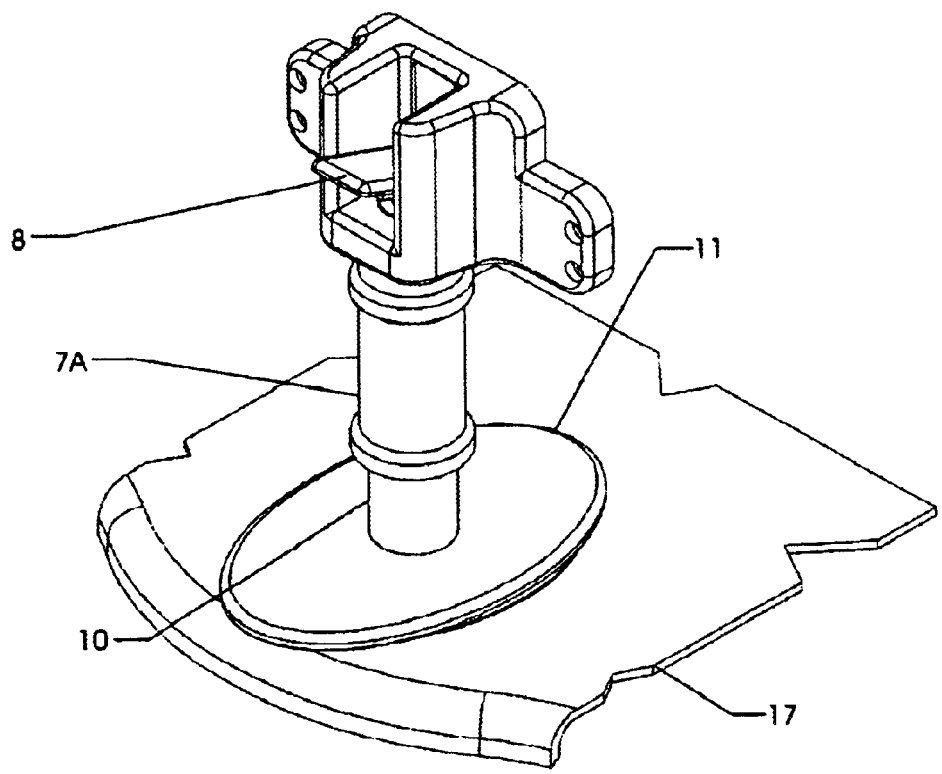
FIG. 3 is another perspective view an adjustable handle according to the invention in the "unocked" position.
Figure 4:
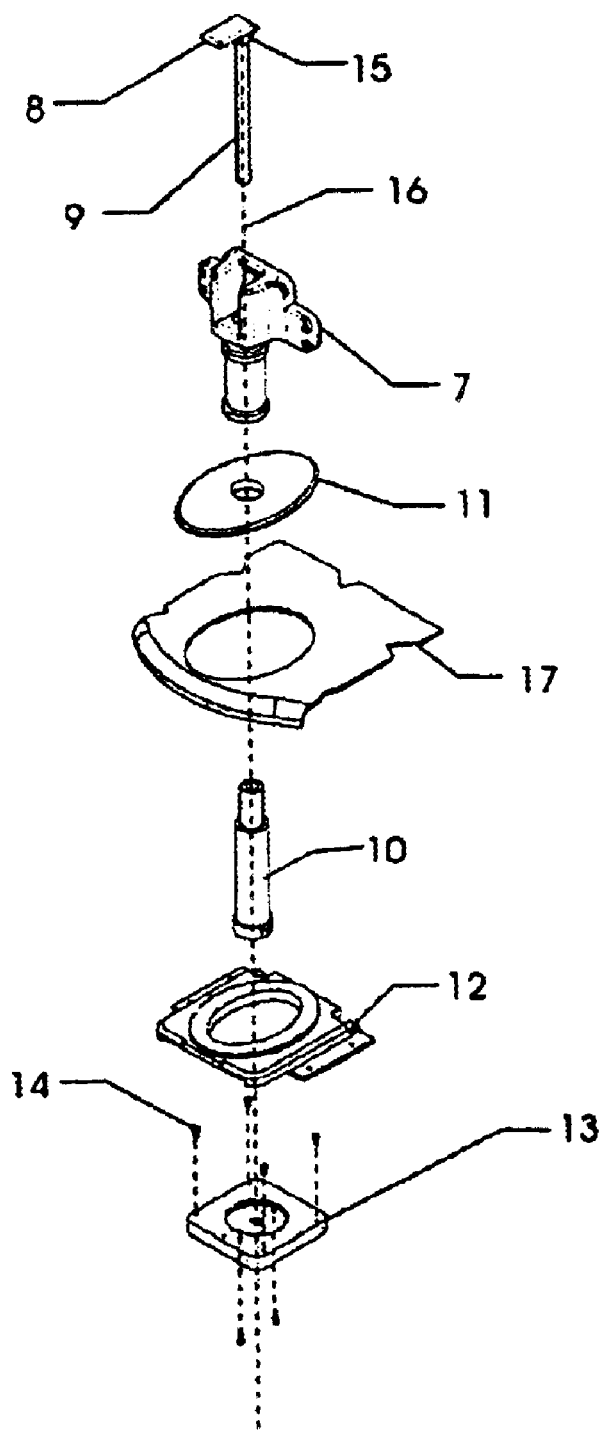
FIG. 4 is an exploded perspective view of an adjustable handle according to the invention.

The right and left head pieces 3, 4 are of a "joystick" design. Each of these head pieces includes, as shown in FIGS. 1 to 4, a head coil paddles 6a, 6b, handles 7a, 7b, a lever 8 located on the top of the handle, a rod 9, an inner handle 10, a handle cover 11, a handle insert 12, and a sled 13. The head coil paddles 6a, 6b are mounted to respective handles 7a, 7b. The lever 8 is mounted to the rod 9 that is attached to the sled 13. Four nylon screws 14 are attached to the sled 13. When the lever 8 is lifted upward, as shown in FIG. 3, the cam 15, as shown in FIG. 4, on the lever 8 unlocks the rod 9, which in turn allows the sled 13 to move freely. By grasping a handle 7a, 7b, as like grasping a joystick, one can move the head pieces 3, 4 in all the three directions of X, Y and Z for about 2" in each direction. In addition, the head pieces 3, 4 can also be rotated for 10 degree about the rod axis 16. When the lever 8 is returned to its locked position (see FIG., 2), the rod 9 moves upward allowing the nylon screws to act as a brake to lock the handles 7a, 7b in place. The head coils inside the head housings are electrically connected to the circuitry inside the base housing 81 through two coil cables 19a, 19b. The right and left head pieces 3, 4 of the present invention can be adjusted independently.

The chest piece 5, or torso array coil of the present invention is a floating and detachable design. The chest piece 5 is placed directly on the chest of the patient 80 (see FIG. 1) and is secured to the base housing cover 17 using two pairs of hook and loop fastened belts 18a, 18b. The chest coil (i.e., the anterior torso coil) inside the chest piece is electrically connected to the circuitry inside the base 81 via a coil cable 20 and a detachable connector 21. The chest piece 5 can be removed when not being used.

The shape of the patient contact surfaces of the head coil paddles 6a, 6b of the present invention conform to an average human facial profile to allow the coil elements to get closer to the carotid arteries of a patient for the best coverage.

The patient contact surfaces of the paddles 6a, 6b are also covered with foam 22 (see FIG. 1) for the purpose of patient comfort. The neck section 23 of the chest piece 5 is flexible and molded with foam to make the present invention even more patient friendly. The chest piece is light on the patient to facilitate breath hold studies. The head pieces 3, 4 are a complete open (face) design (i.e., nothing in the front of a patient's face) to reduce the effects of claustrophobia. Two additional pairs of hook and loop fastened belts 24, 25, one for the chin and the other for the forehead (see FIG. 1), can be used to reduce the motion of a patient's head during imaging if they are needed. The patient is also cushioned by a pad 26.

Figure 5:
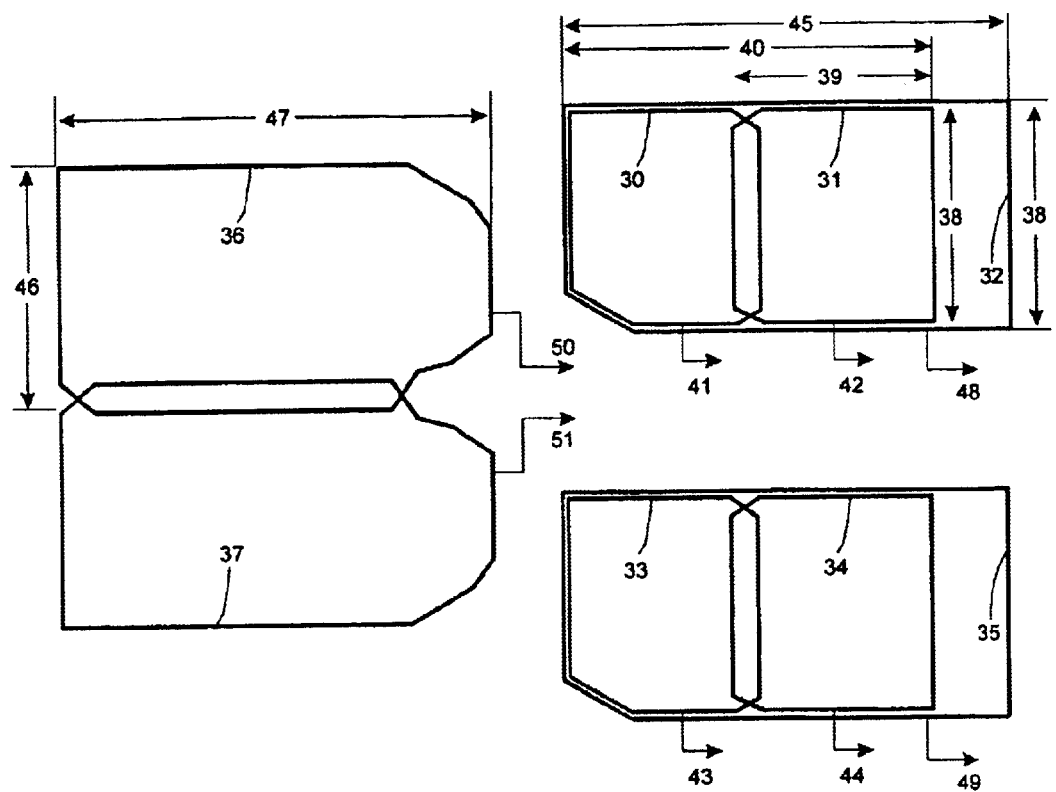
FIG. 5 is a schematic representation of a coil configuration according to the invention.

One embodiment of the electrical arrangement of the array coil 2 is primarily designed for a four-channel MRI scanner system. This design, as shown in FIG. 5, includes eight linear coil elements: three loop coils 30, 31, 32 for imaging the right head region, three loop coils 33, 34, 35, which are the mirror images of the previous three loop coils, for imaging the left head region and the other two loop coils 36, 37 for imaging the torso region.

The physical size (indicated by numerals 38, 39) of the each of the four small loop coils 30, 31, 33, 34 may be, for example, about 10 cm×10 cm. The two small loop coils on each side of the head are isolated from each other by critically coupling into each other. The physical size (indicated by numerals 38, 40) of the combined two small loop coils may be, for example, about 10 cm×18 cm, respectively. The four small loop coils 30, 31,33, 34 form fours channels 41, 42,43, 44 to provide high resolution images for the carotid arteries around the carotid bifurcations The physical size (indicated by numerals 38, 45) of each of the two large head coils 32, 35 may be, for example, about 10 cm×23 cm, respectively and the physical size (indicated by numerals 46, 47) of each of the two torso coils 36, 37) may be, for example, about 11 cm×23 cm, respectively. These four large loop coils 32, 35, 36, 37 form another four channels 48, 49, 50, 51 to provide full FOV coverage (e.g., about 46 cm) for the arteries from the circle of Willis to the aortic arch.

As a result, the RF coil array 2 of the present invention is an integration of two coil systems: a high resolution carotid coil system formed by the four small loop coils 30, 31, 33, 34 and a fall FOV (e.g., 46 cm) vascular coil system foamed by the four large loop coils 32, 35, 36, 37. These two coil systems are used separately, for example, the full FOV vascular coil system should be turned off while using the high resolution carotid coil system and vice versa. Active RF blocking circuitries (i.e., active decoupling chokes) are employed to turn off the coil elements that are not being used.

In addition, the present invention, when being used as a high resolution carotid coil system, can perform either bilateral imaging by using all the four small coils 30, 31, 33, 34 or unilateral imaging by using only the two small coils on one side of the head (i.e., coils 30, 31 for the right carotid artery or coils 33, 34 for the left carotid artery).

Figure 6:
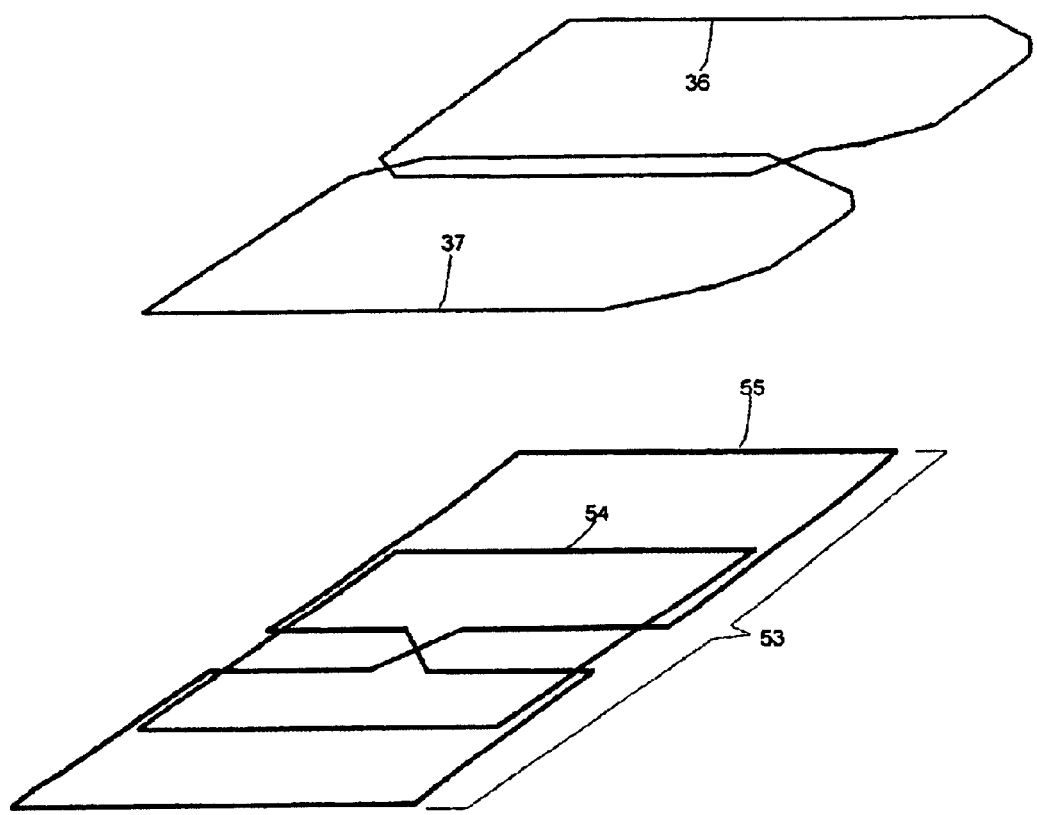
FIG. 6 is a schematic representation of another coil configuration according to the invention.
Figure 7:
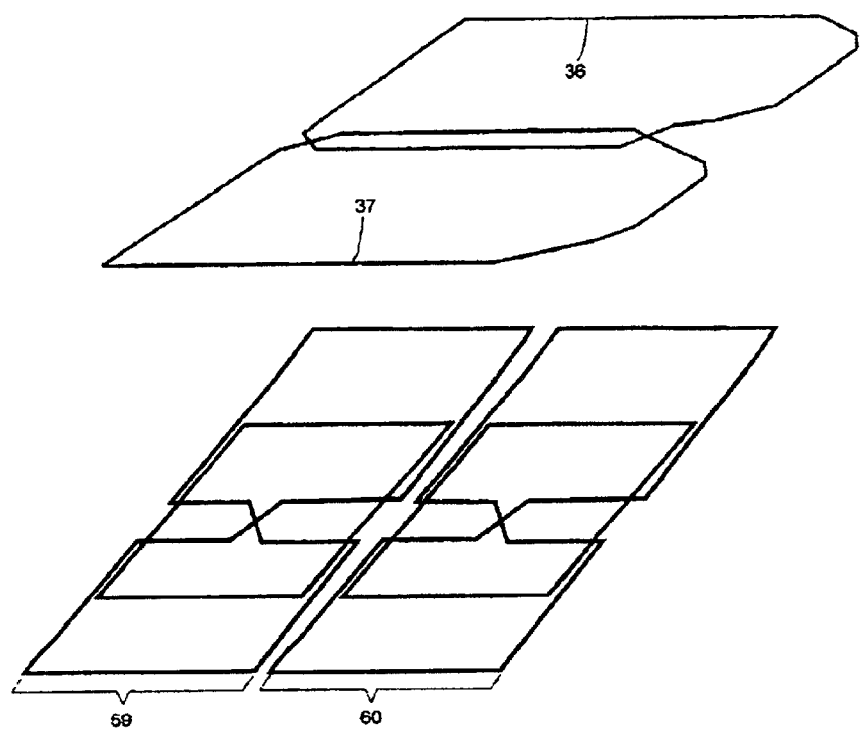
FIG. 7 is a schematic representation of an additional coil configuration according to the invention.
Figure 8:
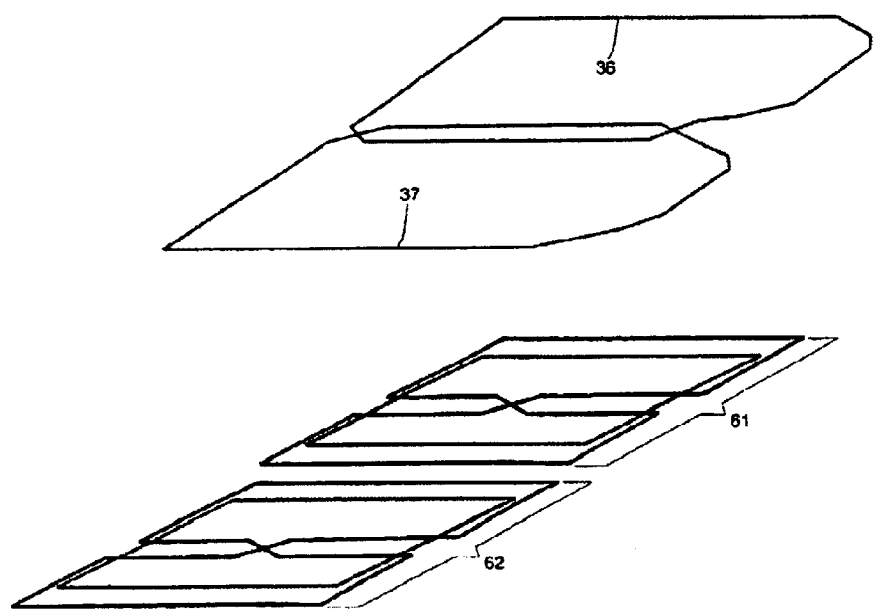
FIG. 8 is a schematic representation of another additional coil configuration according to the invention.

In another embodiment of the electrical arrangement of the invention MRI scanner systems having more than four channels (for example, an 8-channel MRI scanner system), the RF array coil 2 of the present invention is further developed into a vascular and C-spine coil system by adding more channels (i.e., coil elements) for the torso region (see FIGS. 6, 7, and 8). These additional elements, not only can provide good coverage for the vertebral arteries and the cervical spine but also can improve the SNR for aortic arch region as well.

Referring to FIG. 6, a quadrature pair 53 of a loop coil 54 and a saddle coil 55 is used for the posterior torso coil section which is opposite to the two loop coils 36, 37 of the anterior torso coil section. Further performance improvement for the torso imaging can be achieved by using two quadrature pairs 59, 60 arranged in the superior—inferior direction as shown FIG. 7, or two quadrature pairs 61, 62 arranged in the left—right direction as shown in FIG. 8, for the posterior torso coil section.

Figure 9:
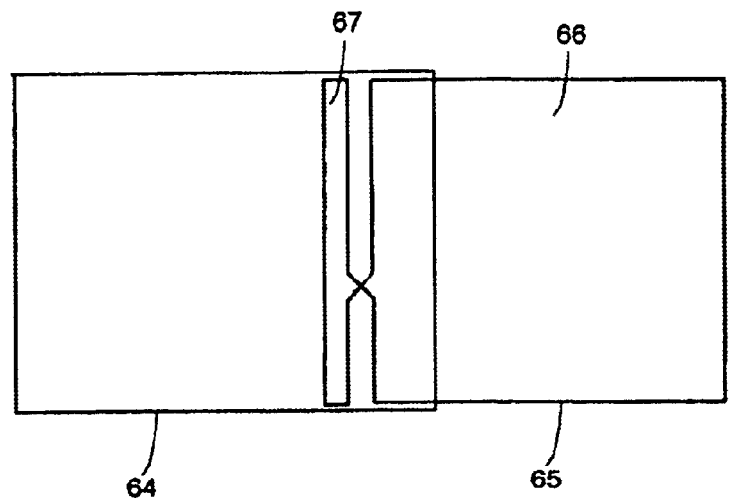
FIG. 9 is a schematic representation of still another coil configuration according to the invention.
Figure 10:
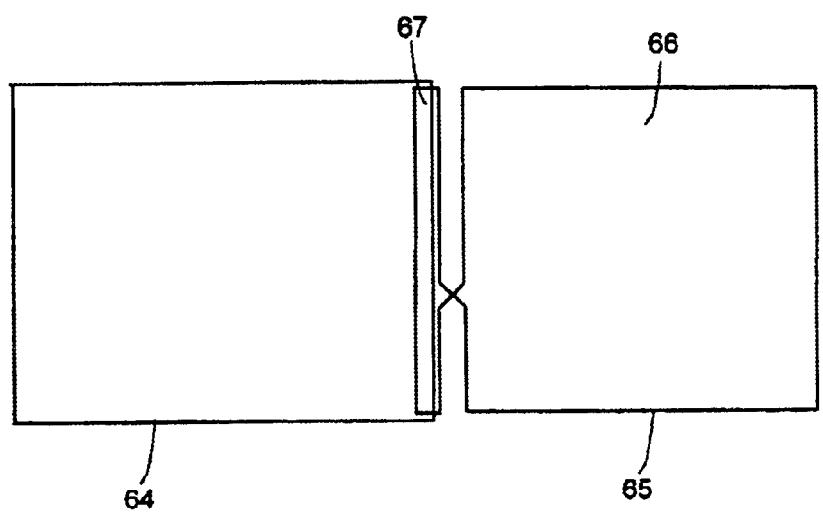
FIG. 10 is a schematic representation of still another additional coil configuration according to the invention.
Figure 11:
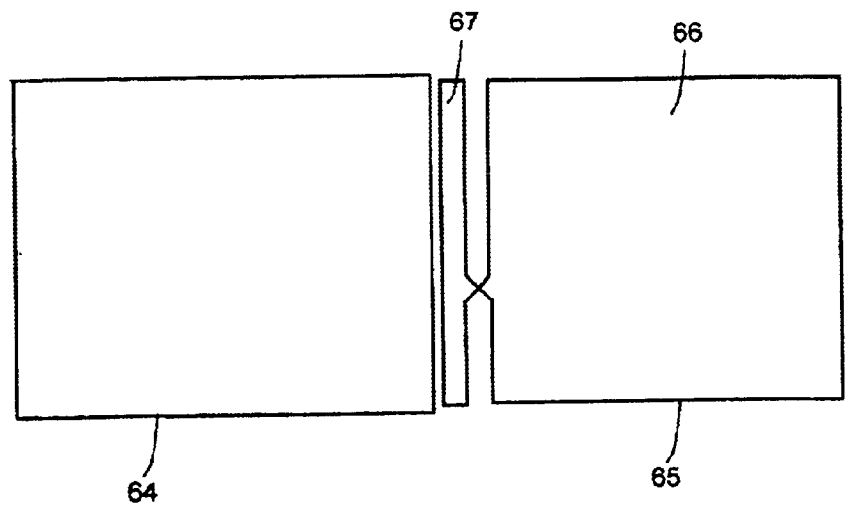
FIG. 11 is a schematic representation of a further coil configuration according to the invention.
Figure 12:
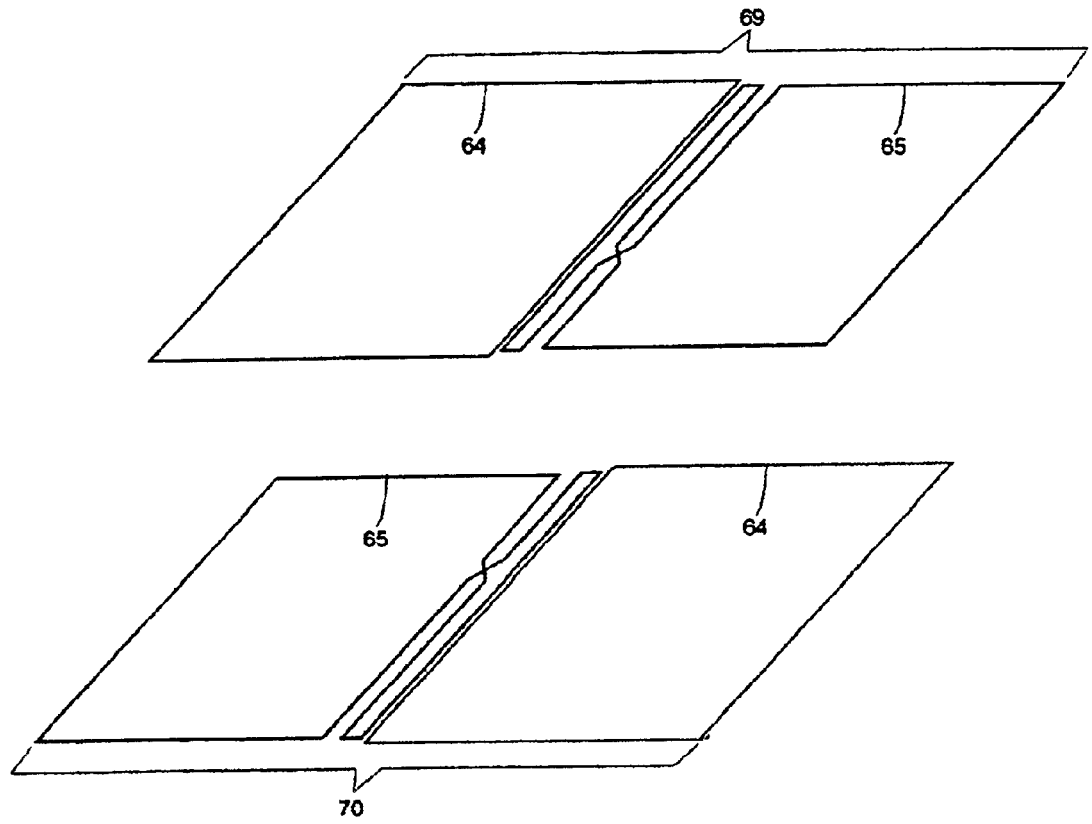
FIG. 12 is a schematic representation of another further coil configuration according to the invention.

Another design for the anterior torso coil section is shown in FIG. 9. In this design, a loop coil 64 and an asymmetric saddle coil 65 critically couples to form the anterior torso coil section. The asymmetric saddle coil 65 functions similar to a loop coil with its large wing 66. The small wing 67 of the asymmetric saddle coil is mainly for the purpose of decoupling the saddle coil 65 from the loop coil 64. The two coils 64, 65 can be decoupled at three different positions: 1) the loop coil 64 overlaps into the large wing 66 of the asymmetric saddle coil 65 (see FIG. 9), 2) the loop coil 64 is adjacent to the large wing 66 and overlaps into the small wing 67 of the asymmetric saddle coil 65 (see FIG. 11) and 3) the loop coil 64 is adjacent the large wing 66 and is outside but adjacent to the small wing 67 of the asymmetric saddle coil 65 (see FIG. 10). This design can also be used for the posterior torso coil section as well. In other words, one pair of these loop—asymmetric saddle coils for the anterior torso coil section 69 and the other pair for the posterior torso coil section 70, as shown in FIG. 12.

The innovative 'joystick' design of the array coil 2 allows the right and left head pieces to be adjusted independently and easily in all the three directions of X, Y and Z. The head pieces can also be rotated for approximately 10 degree about their handle axis.

The human facial shape design for the right and left head paddles allows the coil elements to get closer to the carotid arteries to provide the best coverage for them.

The detachable design for the chest piece allows it to be removed when not being used.

The open face design for the head pieces and the light chest piece reduce the claustrophobic feeling of the patient and make the present invention more patient friendly.

The innovative integration of two coil systems into one design allows the present invention to be used as a dedicated carotid coil for providing high resolution carotid artery imaging around the bifurcation and also as a full FOV vascular coil for covering the arteries from the circle of Willis to the aortic arch.

The high resolution carotid imaging can be performed either in a bilateral mode for both the right and left carotid arteries or in an unilateral mode for only the right or the left carotid artery.

The posterior torso coil elements enable the array coil system of the present invention to image the C-spine coil as well. These posterior torso coil elements not only provide good coverage for the C-spine and the vertebral arteries but also improve the SNR for imaging the aortic arch region.

The loop—asymmetric saddle coil pair design allows the two coils to be decoupled from each other without overlapping into each other. The combination of one loop—asymmetric saddle coil pair for the anterior coil section and the other pair for the posterior coil section not only forms a conventional cardiac coil but also is suitable for the sensitivity encoding (SENSE) applications.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. An MRI array coil comprising:
   a base supporting at least a head of a patient during MRI imaging of the patient;
   a left handle extending out of a plane of said base;
   a left head coil array mounted to and supported by said left handle and wherein said left handle is adjustably positionable and enables said left head coil array to be positioned adjacent a side of said head of the patient;
   a right handle extending out of the plane of said base; and
   a right head coil array mounted to and supported by said right handle and wherein said right handle is adjustably positionable and enables said right head coil array to be positioned adjacent an opposite side of said head of the patient.

2. An MRI array coil according to claim 1, wherein said handles have a joystick configuration and are moveably mounted to said base.

3. An MRI array coil according to claim 1, wherein said right and left coil arrays each comprise two adjacent critically coupled cartoid imaging loop coils.

4. An MRI array coil according to claim 1, further comprising a torso coil array attachable to a torso of the patient and removable attachable to said base for imaging the torso of the patient.

5. An MRI array coil according to claim 4, wherein said right and left coil arrays each comprise two adjacent critically coupled cartoid imaging loop coils and a larger loop coil, each of said larger loop coils and said torso coil array enabling vascular imaging, of the patient, from the head to the torso.

6. An MRI array coil according to claim 5, wherein said torso array coil comprises two loop coils.

7. An MRI array coil according to claim 5, wherein said torso array coil comprises a loop coil and an asymmetrical saddle coil.

8. An MRI array coil according to claim 4, wherein said base further comprises a base coil array opposed to said torso coil array.

9. An MRI array coil according to claim 8, wherein said base coil array comprises a quadrature pair of coils.

10. An MRI array coil according to claim 8, wherein said base coil array comprises a loop coil and an asymmetrical saddle coil.

11. An MRI array coil according to claim 1, wherein said left and right coil arrays are configured to be positioned whereby a patient has an unobstructed view during MRI imaging of the patient.

12. An MRI array coil according to claim 1, wherein said handles are moveably mounted to said base and configured to allow movement of each of said left head coil array and said right head coil array in each of an X, Y and Z direction.

13. An MRI array coil according to claim 1, wherein said handles are moveably mounted to said base and configured to allow movement of said handles independent of each other.

14. An MRI array coil according to claim 1, wherein said handles are moveably mounted to said base and configured to allow rotation of said head coil arrays about an axis of said handles.

15. A MRI array coil comprising:
    a base supporting at least a head of a patient during MRI imaging of the patient;
    a first head piece having a first handle extending out of a plane of said base with a first coil array attached to and supported by said first handle on a first side of the head of the patient, and wherein said first head piece is adjustably positionable adjacent the first side of the head of the patient using said first handle; and
    a second head piece having a second handle extending out of the plane of said base with a second coil array attached to and supported by said second handle on a second side of the head of the patient, and wherein said first head piece is adjustably positionable adjacent the second side of the head of the patient using said second handle, each of said first and second head pieces independently moveable in each of an X, Y and Z direction relative to said base and enabling the positioning of said first and second coil arrays adjacent the head on either side of the head of the patient.

16. An MRI array coil according to claim 15, wherein said first and second headpieces are configured to enable rotation of said first and second coil arrays about an axis of said handles.

17. An MRI array coil according to claim 15, wherein said first and second head pieces are configured to allow moveable operation of said first and second coil arrays along an axis of said handles.

18. An MRI array coil according to claim 15, further comprising a third coil array positionable adjacent a torso of the patient and removably attachable to said base to image a torso of the patient.

19. A method for magnetic resonance imaging comprising:
- configuring a first coil array to connect to a first handle extending out of a plane of a base for adjustable positioning and support of said first coil array adjacent a side of a head of a patient during magnetic resonance imaging of the head; and
- configuring a second coil array to connect to a second handle extending out of the plane of the base for adjustable positioning and support of said second coil array adjacent an opposite side of the head of the patient during magnetic resonance imaging of the head, each of the first and second handles being independently moveable and configured to allow movement of the first and second coil arrays in each of an X,Y and Z direction.

20. A method in accordance with claim 19, further comprising configuring said first and second coil arrays for rotatable operation about an axis of said handles.

\* \* \* \* \*